(12) United States Patent
Akiyama et al.

(10) Patent No.: US 7,696,059 B2
(45) Date of Patent: Apr. 13, 2010

(54) METHOD FOR MANUFACTURING SEMICONDUCTOR SUBSTRATE

(75) Inventors: Shoji Akiyama, Gunma (JP); Yoshihiro Kubota, Gunma (JP); Atsuo Ito, Gunma (JP); Makoto Kawai, Gunma (JP); Yuuji Tobisaka, Gunma (JP); Koichi Tanaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 11 days.

(21) Appl. No.: 12/285,409

(22) Filed: Oct. 3, 2008

(65) Prior Publication Data

US 2009/0111237 A1 Apr. 30, 2009

(30) Foreign Application Priority Data

Oct. 25, 2007 (JP) .............................. 2007-277504

(51) Int. Cl.
*H01L 21/76* (2006.01)
(52) U.S. Cl. ...................................... 438/407; 438/459
(58) Field of Classification Search ................. 438/407, 438/459
See application file for complete search history.

(56) References Cited

U.S. PATENT DOCUMENTS 6,558,802 B1 * 5/2003 Henley et al. ............... 428/446

2009/0085176 A1 * 4/2009 Couillard et al. ............ 257/655

FOREIGN PATENT DOCUMENTS

JP B2 3048201 6/2000

OTHER PUBLICATIONS

Auberton-Herve et al., "Smart Cut Technology: Industrial Status of SOI Wafer Production and New Material Developments," *Electrochemical Society Proceedings*, vol. 99, No. 3, pp. 93-106, 1999.
Kurokawa et al., "Reduction of the Interfacial Si Displacement of Ultrathin $SiO_2$ Film on Si (100) Formed by Highly-concentrated Ozone," *Bulletin of the Electrotechnical Laboratory*, vol. 63, No. 12, pp. 19-25, 2000.
Ohmi et al., "Low-temperature Formation of Silicon Oxide Films using Microwave-excited $Kr/O_2$ Plasma," *Oyo Buturi*, vol. 69, No. 10, pp. 1200-1204, 2000.

* cited by examiner

*Primary Examiner*—Bradley K Smith
(74) *Attorney, Agent, or Firm*—Oliff & Berridge, PLC

(57) ABSTRACT

A consistent reduction in temperature in an SOI substrate manufacturing process is achieved.

A gate oxide film provided on an SOI substrate is obtained by laminating a low-temperature thermal oxide film 13 grown at a temperature of 450° C. or below and an oxide film 14 obtained based on a CVD method. Since the thermal oxide film 13 is a thin film of 100 Å or below, a low temperature of 450° C. or below can suffice. The underlying thermal oxide film 13 can suppress a structural defect, e.g., an interface state, and the CVD oxide film 14 formed on the thermal oxide film can be used to adjust a thickness of the gate oxide film. According to such a technique, a conventional general silicon oxide film forming apparatus can be used to form the gate oxide film at a low temperature, thereby achieving a consistent reduction in temperature in the SOI substrate manufacturing process.

16 Claims, 1 Drawing Sheet bonded substrate to provide an SOI substrate having a silicon film on the main surface of the transparent insulator substrate; a step of performing a flattening treatment with respect to the silicon film of the SOI substrate; a step of thermally oxidizing the flattened surface of the silicon film at a temperature of 450° C. or below to form an oxide film of 100 Å or below; and a step of depositing an oxide film on the thermal oxide film based on a CVD method to form a gate oxide film.

METHOD FOR MANUFACTURING SEMICONDUCTOR SUBSTRATE

BACKGROUND OF THE INVENTION

1. Field of the Invention

The present invention relates to a method for manufacturing a semiconductor substrate having a silicon film on a transparent insulator substrate.

2. Description of the Related Art

As a semiconductor substrate that enables high performances of a semiconductor device, an SOI (Silicon On Insulator) substrate is attracting attention (see, e.g., Japanese Patent No. 3048201 or A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106).). That is because adopting an SOI structure to bury an oxide film below a single-crystal silicon thin film enables reducing a parasitic capacitance, improving an operating speed, and suppressing a power consumption.

When the SOI substrate is utilized as an optical device, a support substrate that is bonded to a silicon substrate must be a transparent insulator substrate, and from the viewpoint of a cost reduction, a borosilicate glass substrate or a crystallized glass substrate is also examined besides a quartz substrate or a sapphire substrate as such a substrate.

However, since each of these transparent insulator substrate has a thermal expansion coefficient greatly different from that of a silicon crystal, there occurs a problem that a bonded substrate or an SOI substrate is broken or cracked when a manufacturing process of the SOI substrate includes a high-temperature process. Therefore, a reduction in temperature in the entire manufacturing process of the SOI substrate is demanded, and a reduction in temperature must be achieved in a process of forming a gate oxide film after forming an SOI film on a transparent insulator substrate in particular.

In recent years, as a low-temperature oxidation technology that can substitute for thermal oxidation requiring a high temperature, an oxidation method using highly-concentrated ozone (Akira Kurokawa et al., "Interface Structure of Ultrathin $SiO_2$ Film Formed by Highly-concentrated Ozone" (Bulletin of the Electrotechnical Laboratory, Vol. 63, No. 12, p. 501-507, (2000)).) or an oxidation method using a microwave-excited plasma (Tadahiro Ohmi et al., "Low-temperature Formation of Silicon Oxide Films using Microwave-excited Kr/02 Plasma", "OYO BUTURI" (Vol. 69, No. 10, p. 1200-1204, (2000)).) is also proposed, but these techniques require a special oxidation system different from that in a conventional apparatus.

SUMMARY OF THE INVENTION

In view of the above-explained problem, it is an object of the present invention to provide an SOI substrate having a gate oxide film formed at a low temperature by using a conventional general silicon oxide film forming apparatus.

To solve such a problem, a method for manufacturing a semiconductor substrate according to the present invention comprises: an ion implantation step of forming a hydrogen ion implanted layer to a main surface of a silicon substrate; a surface treatment step of performing a plasma treatment with respect to a main surface of at least one of a transparent insulator substrate and the silicon substrate; a step of bonding the main surfaces of the transparent insulator substrate and the silicon substrate to each other; a delamination step of mechanically delaminating a silicon thin film from the silicon substrate of the bonded substrate to provide an SOI substrate having a silicon film on the main surface of the transparent insulator substrate; a step of performing a flattening treatment with respect to the silicon film of the SOI substrate; a step of thermally oxidizing the flattened surface of the silicon film at a temperature of 450° C. or below to form an oxide film of 100 Å or below; and a step of depositing an oxide film on the thermal oxide film based on a CVD method to form a gate oxide film.

Oxidation based on the CVD method may be carried out by using at least one of a mixed gas containing $N_2O$ and $SiH_4$, a mixed gas containing $O_2$ and $SiH_4$, and a TEOS gas.

It is preferable for the method for manufacturing a semiconductor substrate according to the present invention to further comprise a step of performing a heat treatment in an inert gas atmosphere containing hydrogen at a concentration of 0.1 to 4 mol % after the formation of the oxide film based on the CVD method.

Further, a step of performing a heat treatment with respect to the bonded substrate at a temperature of 100 to 300° C. may be provided before the delamination step.

The transparent insulator substrate used in the present invention is, for example, a quartz substrate, a sapphire substrate, a borosilicate glass substrate, or a crystallized glass substrate.

In the present invention, since the gate oxide film formed on the SOI substrate is obtained by laminating the low-temperature thermal oxide film grown at a temperature of 450° C. or below and the oxide film formed based on the CVD method, the underlying thermal oxide film can suppress a structural defect, e.g., an interface state, and the CVD oxide film formed on the thermal oxide film enables adjusting a thickness of the gate oxide film. According to such a technique, a conventional general silicon oxide film forming apparatus can be used to form the gate oxide film at a low temperature, thereby achieving a consistent reduction in temperature in the SOI substrate manufacturing process.

DETAILED DESCRIPTION OF THE PREFERRED EMBODIMENTS

Figure 1:
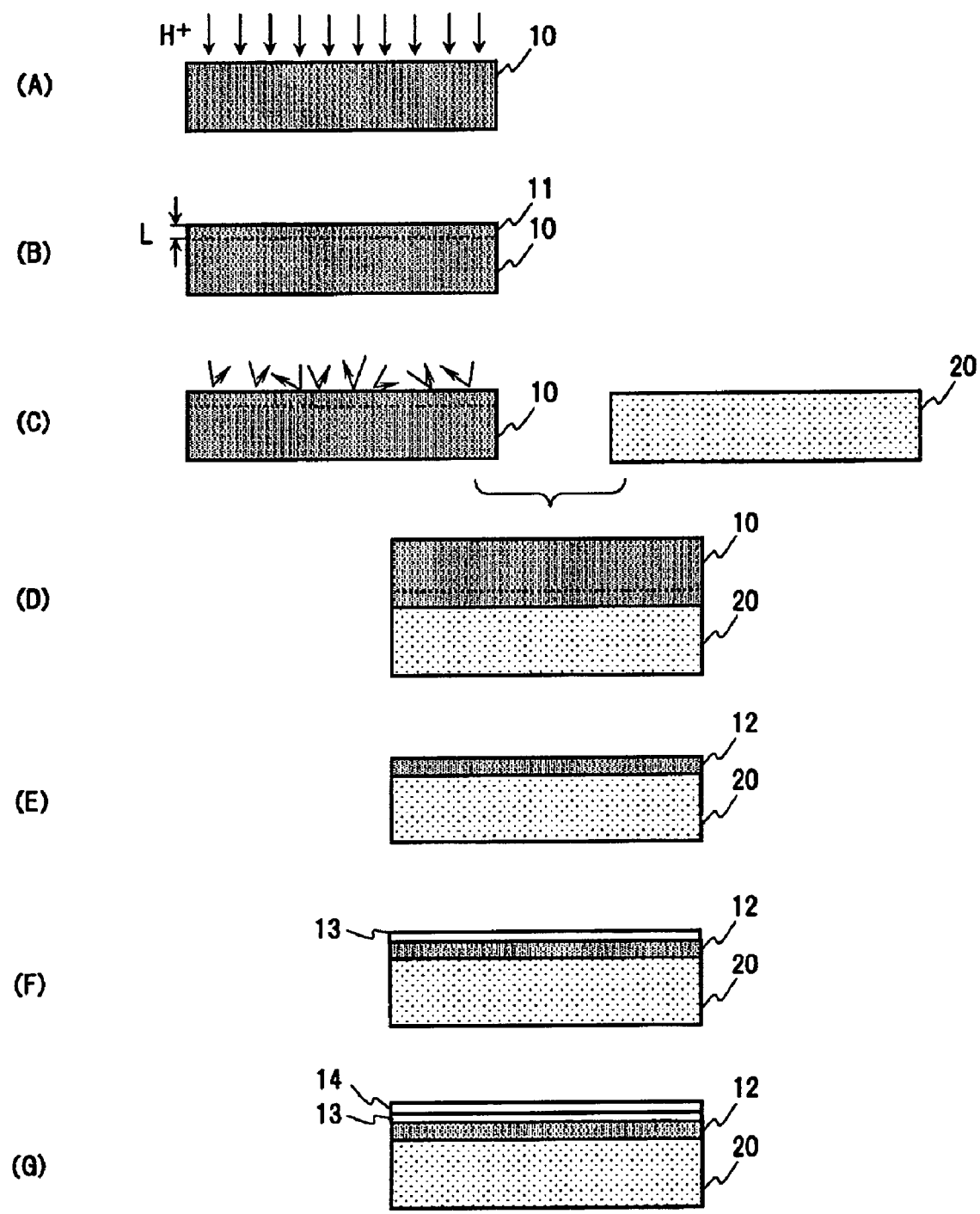
FIG. 1 is a view for explaining a process example of a method for manufacturing a semiconductor substrate according to the present invention.

A method for manufacturing a semiconductor substrate according to the present invention will now be explained based on an example. It is to be noted that a transparent insulator substrate will be described as a quartz substrate in the following example, but the transparent insulator substrate used in the present invention may be a sapphire substrate, a borosilicate glass substrate, or a crystallized glass substrate.

EXAMPLE

FIG. 1 is a view for explaining a process example of a method for manufacturing a semiconductor substrate according to the present invention. A silicon substrate 10 depicted in FIG. 1(A) is generally a single-crystal Si substrate, and a support substrate is a quartz substrate 20. Here, the single-crystal Si substrate 10 is, for example, a generally commercially available Si substrate grown based on a CZ method (Czochralski method), and an electrical characteristic value such as a conductivity type and a specific resistance, a crystal orientation, or a crystal diameter thereof is appropriately selected in dependence on a design value or a process of a device adopting an SOI substrate manufactured by the method according to the present invention or a display area of a device to be manufactured. It is to be noted that an oxide film may be formed in advance on a surface (a bonding surface) of this single-crystal Si substrate 10 by a method such as thermal oxidation.

The single-crystal Si substrate 10 and the quartz substrate 20 to be bonded to each other have the same diameter. When the same orientation flat (OF) as an OF provided to the single-crystal Si substrate 10 is likewise provided to the quartz substrate 20 and these substrates are bonded while matching these OFs with each other, this will be convenient for a subsequent device formation process.

First, hydrogen ions are implanted into a surface of the single-crystal Si substrate 10 under the condition that the temperature of the Si substrate 10 is maintained at a temperature of not higher than 400° C. (400° C. or below) (FIG. 1(A)). This ion implanted surface becomes a "joint surface (bonding surface)" later. By implanting hydrogen ions, a uniform ion implanted layer 11 is formed at a predetermined depth (an average ion implanted depth L) near the surface of the single-crystal Si substrate 10 (FIG. 1(B)). When a temperature of the Si substrate 10 during the ion implantation process is maintained at 400° C. or below, occurrence of a so-called "micro-cavity" can be remarkably suppressed. It is to be noted that the temperature of the single-crystal Si substrate 10 at the time of hydrogen ion implantation is set to fall within the range of 200° C. to 400° C. in this example.

As a dose amount at the time of implanting hydrogen ions, an appropriate value is selected from the range of, e.g., $1\times10^{16}$ to $4\times10^{17}$ atoms/cm$^2$ in accordance with, e.g., a specification of the SOI substrate. It is to be noted that a dose amount of more than $1\times10^{17}$ atoms/cm$^2$ has conventionally been considered to bring about surface roughness of a resultant SOI layer, thus the dose amount is generally set to approximately $7\times10^{16}$ atoms/cm$^2$. However, the investigation of the present inventors has revealed that the cause of the surface roughness of the SOI layer occurring under the above-mentioned ion-implanting condition considered to occur in a conventional method lies not in a dose amount of hydrogen ions itself but in a diffusion phenomenon of hydrogen generating in a step of heat-treatment at a relatively high temperature (e. g. 500° C.) adopted to obtain an SOI layer by delaminating a silicon thin film.

Therefore in a case where an integrated low-temperature process including a step of hydrogen ion implantation is adopted as the present invention, not only the step of hydrogen ion implantation but also a step of delaminating is carried out at a low temperature. Thus the diffusion of hydrogen atoms in the step of delamination-treatment is remarkably suppressed, with the result that no surface roughness of the SOI layer occur even if hydrogen ion implantation is performed at a high dose amount. The present inventors investigated the influence on the surface roughness of the SOI layer by performing hydrogen ion implantation at various dose amounts. As a result, no surface roughness was observed at least to a dose amount of $4\times10^{17}$ atoms/cm$^2$ as far as the delamination of the silicon thin film is performed by a heat treatment at a low temperature of 400° C. or below.

A depth of the ion implanted layer 11 from the surface of the single-crystal Si substrate 10 (an average ion implantation depth L) is controlled by an acceleration voltage at the time of ion implantation and determined in dependence on a thickness of the SOI layer to be delaminated. For example, the average ion implantation depth L is set to 0.5 µm or below and the acceleration voltage is set to 50 to 100 KeV. It is to be noted that an insulator film, e.g., an oxide film may be formed in advance on an ion implanted surface of the single-crystal Si substrate 10 and ion implantation may be carried out through this insulator film as usually carried out for suppressing channeling of implanted ions in a process of implanting ions into Si crystal.

After this hydrogen ion implantation, the joint surface of the single-crystal Si substrate 10 is subjected to a plasma treatment that is intended to perform, e.g., surface cleaning or surface activation (FIG. 1(C)) It is to be noted that this plasma treatment is carried out for the purpose of removing an organic matter or increasing an OH group to achieve surface activation on the surface as the joint surface, and it may be performed with respect to the joint surfaces of both the single-crystal Si substrate 10 and the quartz substrate 20 or may be performed with respect to the joint surface of the quartz substrate 20 alone. That is, carrying out this treatment with respect to the joint surface of any one of the single-crystal Si substrate 10 and the quartz substrate 20 can suffice.

In this plasma treatment, the single-crystal Si substrate and/or the quartz substrate with the surfaces cleaned in advance by, e.g., RCA cleaning is mounted on a sample stage in a vacuum chamber, a plasma gas is introduced into the vacuum chamber so as to have a predetermined vacuum degree and then the plasma treatment is performed. It is to be noted that, as the type of the plasma gas used herein, there is, e.g., an oxygen gas, a hydrogen gas, an argon gas, a mixture of these gases, or a mixture of the hydrogen gas and a helium gas. After introducing the plasma gas, a high-frequency plasma having a power of approximately 100 W is generated, and a treatment is performed with respect to the surface of the single-crystal Si substrate and/or the quartz substrate as a plasma treatment target for approximately 5 to 10 seconds, thereby terminating the process.

The surfaces of the single-crystal Si substrate 10 and the quartz substrate 20 subjected to such a surface treatment are pressed against each other as the joint surfaces to be bonded (FIG. 1(D)). As explained above, since the surface (the joint surface) of at least one of the single-crystal Si substrate 10 and the quartz substrate 20 is activated because of the surface treatment based on the plasma treatment, bonding strength that can sufficiently resist mechanical delamination or mechanical polishing in a subsequent process can be obtained even in a state where the substrates are pressed against each other (bonded) at a room temperature.

It is to be noted that, after the bonding process shown in FIG. 1(D), a process of performing a heat treatment at a temperature of 100 to 300° C. in a state where the single-crystal Si substrate 10 is bonded to the quartz substrate 20 may be provided before the delamination process. This heat treatment process is mainly intended to obtain an effect of increasing bonding strength of the single-crystal silicon substrate 10 and the quartz substrate 20.

A main reason for setting a temperature in this heat treatment process to 300° C. or below is prevention of occurrence of the above-explained "micro-cavity" as well as consideration on a difference in thermal expansion coefficient between single-crystal silicon and quartz, an amount of strain caused due to this difference in thermal expansion coefficient, and a relationship between this amount of strain and thicknesses of the single-crystal silicon substrate 10 and the quartz substrate 20.

It is to be noted that a secondary effect can be expected from this heat treatment. That is, a heat stress caused due to the difference in thermal expansion coefficient between the single-crystal Si substrate 10 and the quartz substrate 20 is generated to weaken chemical bonding of silicon atoms in the ion implanted layer 11 depending on an amount of the implanted hydrogen ions.

After such a treatment, an external shock is given to the bonded substrate by any technique, and a silicon film is mechanically delaminated from a bulk of the single-crystal silicon, thereby obtaining a semiconductor substrate (an SOI substrate) having a silicon film (an SOI film) 12 on the quartz substrate 20 (FIG. 1(E)). It is to be noted that various techniques are present as the technique of giving the shock from the outside to delaminate the silicon film (the SOI film) 12, but this delamination is carried out without heating in this example.

Measuring a region of 10 µm×10 µm on the surface of the thus obtained SOI film after delamination by using an atomic force microscope (AFM), an average value of RMS was as good as 5 nm or below. Further, a substrate plane radial variation (PV "peak to valley") of the SOI film was 4 nm or below. Such a relatively smooth delamination surface can be obtained because a delamination mechanism is different from that in conventional thermal delamination.

The surface of the obtained SOI substrate (an SOI film surface) is subjected to CMP polishing to be flattened, and further cleaned to be a clean surface.

The SOI substrate according to the present invention has a gate oxide film, and the oxide film is formed based on the following two processes. First, the clean surface of the SOI film 12 is thermally oxidized at a low temperature of 450° C. or below, thereby forming a thin underlying thermal oxide film 13 having a thickness of 100 Å or below (FIG. 1(F)). A general thermal oxide film requires a temperature of 900° C. or above, but a low temperature of 450° C. or below can suffice since the thermal oxide film 13 is formed as a thin film having a thickness of 100 Å or below in the present invention. For example, when thermal oxidation was carried out at 450° C. based on a dry oxidation method for 12 hours, a thermal oxide film having a thickness of 85 Å was obtained.

Then, an oxide film 14 is further deposited on the thermal oxide film 13 based on a CVD method at a temperature of 600° C. or below (FIG. 1(G)). This oxide film 14 and the thermal oxide film 13 serve as a gate oxide film. As an oxidation gas used in the CVD method, for example, a mixed gas of $N_2O$ and $SiH_4$, a mixed gas of $O_2$ and $SiH_4$, or a TEOS gas may be used.

The gate oxide film having such a structure is advantageous in that the underlying thermal oxide film 13 can suppress a structural defect, e.g., an interface state and the CVD oxide film 14 formed on the thermal oxide film can be used to adjust a thickness of the film. Adopting such an oxidation technique enables obtaining an optimum gate oxide film thickness and also consistently carrying out the formation process of the gate oxide film at a low temperature, thereby suppressing occurrence of a crystal defect in the silicon film of a composite substrate (a substrate including a silicon film on a quartz substrate, a sapphire substrate, a borosilicate glass substrate, or a crystallized glass substrate) formed of materials having different thermal expansion coefficients.

It is to be noted that a process of performing a heat treatment in an inert gas atmosphere containing hydrogen at a concentration of 0.1 to 4 mol % may be provided after formation of the CVD oxide film 14 for the purpose of electrically inactivating a structural defect in the thermal oxide film 13 and the CVD oxide film 14. Since a reaction rate is basically in proportion to a partial pressure of hydrogen, there is no lower limit of a hydrogen concentration in particular (increasing an oxidation time may suffice), but 0.1 mol % or above is realistically desirable. In relation to an upper limit of the same, a forming gas having an explosion limit or below (a hydrogen concentration of 4 mol % or below) is easy to be handled.

According to the present invention, a conventional general silicon oxide film forming apparatus can be used to form a gate oxide film at a low temperature, thus achieving a consistent reduction in temperature in the SOI substrate manufacturing process.

What is claimed is:

1. A method for manufacturing a semiconductor substrate comprising:

an ion implantation step of forming a hydrogen ion implanted layer to a main surface of a silicon substrate;

a surface treatment step of performing a plasma treatment with respect to a main surface of at least one of a transparent insulator substrate and the silicon substrate;

a step of bonding the main surfaces of the transparent insulator substrate and the silicon substrate to each other;

a delamination step of mechanically delaminating a silicon thin film from the silicon substrate of the bonded substrate to provide an SOI substrate having a silicon film on the main surface of the transparent insulator substrate;

a step of performing a flattening treatment with respect to the silicon film of the SOI substrate;

a step of thermally oxidizing the flattened surface of the silicon film at a temperature of 450° C. or below to form an oxide film of 100 Å or below; and a step of depositing an oxide film on the thermal oxide film based on a CVD method to form a gate oxide film.

2. The method for manufacturing a semiconductor substrate according to claim 1, wherein oxidation based on the CVD method is carried out by using at least one of a mixed gas containing $N_2O$ and $SiH_4$, a mixed gas containing $O_2$ and $SiH_4$, and a TEOS gas.

3. The method for manufacturing a semiconductor substrate according to claim 1, further comprising a step of performing a heat treatment in an inert gas atmosphere containing hydrogen at a concentration of 0.1 to 4 mol % after formation of the oxide film based on the CVD method.

4. The method for manufacturing a semiconductor substrate according to claim 2, further comprising a step of performing a heat treatment in an inert gas atmosphere containing hydrogen at a concentration of 0.1 to 4 mol % after formation of the oxide film based on the CVD method.

5. The method for manufacturing a semiconductor substrate according to claim 1, comprising a step of performing a heat treatment with respect to the bonded substrate at a temperature of 100 to 300° C. before the delamination step.

6. The method for manufacturing a semiconductor substrate according to claim 2, comprising a step of performing a heat treatment with respect to the bonded substrate at a temperature of 100 to 300° C. before the delamination step.

7. The method for manufacturing a semiconductor substrate according to claim 3, comprising a step of performing a heat treatment with respect to the bonded substrate at a temperature of 100 to 300° C. before the delamination step.

8. The method for manufacturing a semiconductor substrate according to claim 4, comprising a step of performing a heat treatment with respect to the bonded substrate at a temperature of 100 to 300° C. before the delamination step.

9. The method for manufacturing a semiconductor substrate according to claim 1, wherein the transparent insulator substrate is any one of a quartz substrate, a sapphire substrate, a borosilicate glass substrate, and a crystallized glass substrate.

10. The method for manufacturing a semiconductor substrate according to claim 2, wherein the transparent insulator substrate is any one of a quartz substrate, a sapphire substrate, a borosilicate glass substrate, and a crystallized glass substrate.

11. The method for manufacturing a semiconductor substrate according to claim 3, wherein the transparent insulator substrate is any one of a quartz substrate, a sapphire substrate, a borosilicate glass substrate, and a crystallized glass substrate.

12. The method for manufacturing a semiconductor substrate according to claim 4, wherein the transparent insulator substrate is any one of a quartz substrate, a sapphire substrate, a borosilicate glass substrate, and a crystallized glass substrate.

13. The method for manufacturing a semiconductor substrate according to claim 5, wherein the transparent insulator substrate is any one of a quartz substrate, a sapphire substrate, a borosilicate glass substrate, and a crystallized glass substrate.

14. The method for manufacturing a semiconductor substrate according to claim 6, wherein the transparent insulator substrate is any one of a quartz substrate, a sapphire substrate, a borosilicate glass substrate, and a crystallized glass substrate.

15. The method for manufacturing a semiconductor substrate according to claim 7, wherein the transparent insulator substrate is any one of a quartz substrate, a sapphire substrate, a borosilicate glass substrate, and a crystallized glass substrate.

16. The method for manufacturing a semiconductor substrate according to claim 8, wherein the transparent insulator substrate is any one of a quartz substrate, a sapphire substrate, a borosilicate glass substrate, and a crystallized glass substrate.

\* \* \* \* \*